(12) United States Patent
Harney et al.

(10) Patent No.: US 10,206,047 B2
(45) Date of Patent: Feb. 12, 2019

(54) MICRO-ELECTRO-MECHANICAL SYSTEM MICROPHONE WITH DUAL BACKPLATES

(71) Applicant: INVENSENSE, INC., San Jose, CA (US)

(72) Inventors: Kieran Harney, Andover, MA (US); Adrianus Maria Lafort, Delft (NL); Brian Moss, Limerick (IE); Dion Ivo De Roo, Voorburg (NL)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 15/141,335

(22) Filed: Apr. 28, 2016

(65) Prior Publication Data

US 2017/0318395 A1 Nov. 2, 2017

(51) Int. Cl.
| | |
|---|---|
| *H04R 19/04* | (2006.01) |
| *H04R 1/04* | (2006.01) |
| *B81B 3/00* | (2006.01) |
| *H04R 7/06* | (2006.01) |
| *H04R 19/01* | (2006.01) |

(52) U.S. Cl.
CPC ........... *H04R 19/04* (2013.01); *B81B 3/0018* (2013.01); *H04R 1/04* (2013.01); *H04R 7/06* (2013.01); *H04R 19/01* (2013.01); *H04R 2201/003* (2013.01); *H04R 2410/03* (2013.01)

(58) Field of Classification Search
CPC ...... H04R 19/04; H04R 1/04; H04R 2410/03; H04R 19/01; H04R 7/06; H04R 2201/003; B81B 3/0018
USPC ............... 381/113, 122, 120, 396, 398, 399; 330/296, 285
See application file for complete search history.

(56) References Cited

U.S. PATENT DOCUMENTS

| | | | |
|---|---|---|---|
| 8,590,136 B2 | 11/2013 | Yang et al. | |
| 2012/0080764 A1* | 4/2012 | Xue | B81B 7/0074 |
| | | | 257/417 |

(Continued)

FOREIGN PATENT DOCUMENTS

| | | |
|---|---|---|
| WO | 2011025939 | 3/2011 |
| WO | WO2013167183 A1 * | 11/2013 |

OTHER PUBLICATIONS

Walser, et al., "A Novel Method for Reducing the Sensitivity Deviation of MEMS Microphones by Programming," Procedia Engineering, 2015, pp. 206-209, vol. 120, Elsevier.

(Continued)

*Primary Examiner* — Vivian Chin
*Assistant Examiner* — Con P Tran
(74) *Attorney, Agent, or Firm* — Amin, Turocy & Watson, LLP

(57) ABSTRACT

Improving noise rejection of a micro-electro-mechanical system (MEMS) microphone by utilizing a membrane sandwiched between oppositely biased backplates is presented herein. The MEMS microphone can comprise a diaphragm that converts an acoustic pressure into an electrical signal; a first backplate capacitively coupled to a first side of the diaphragm—the first backplate biased at a first direct current (DC) voltage; a second backplate capacitively coupled to a second side of the diaphragm—the second backplate biased at a second DC voltage; and an electronic amplifier that buffers the electrical signal to generate a buffered output signal representing the acoustic pressure.

18 Claims, 9 Drawing Sheets

(56) References Cited

U.S. PATENT DOCUMENTS

| | | | |
|---|---|---|---|
| 2012/0328142 A1* | 12/2012 | Horibe | H04R 1/406 381/355 |
| 2013/0044899 A1* | 2/2013 | Barber | H04R 19/016 381/113 |
| 2014/0072152 A1* | 3/2014 | Yang | H04R 19/005 381/174 |
| 2015/0023529 A1 | 1/2015 | Barzen et al. | |
| 2015/0129992 A1 | 5/2015 | Hur et al. | |

OTHER PUBLICATIONS

Dehe, "Silicon MEMS Microphone: an Innovation driven Success Story prepared for Future Challenges," 2015, European MEMS Summit, Infineon Technologies AG, 29 pages.

International Search Report and Written Opinion dated Jul. 21, 2017 for International Application No. PCT/US2017/029943, 13 pages.

\* cited by examiner

MICRO-ELECTRO-MECHANICAL SYSTEM MICROPHONE WITH DUAL BACKPLATES

TECHNICAL FIELD

The subject disclosure generally relates to embodiments for a micro-electro-mechanical system (MEMS) microphone with dual backplates.

BACKGROUND

Conventionally, a MEMS microphone is susceptible to electromagnetic interference (EMI). In this regard, conventional microphone technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
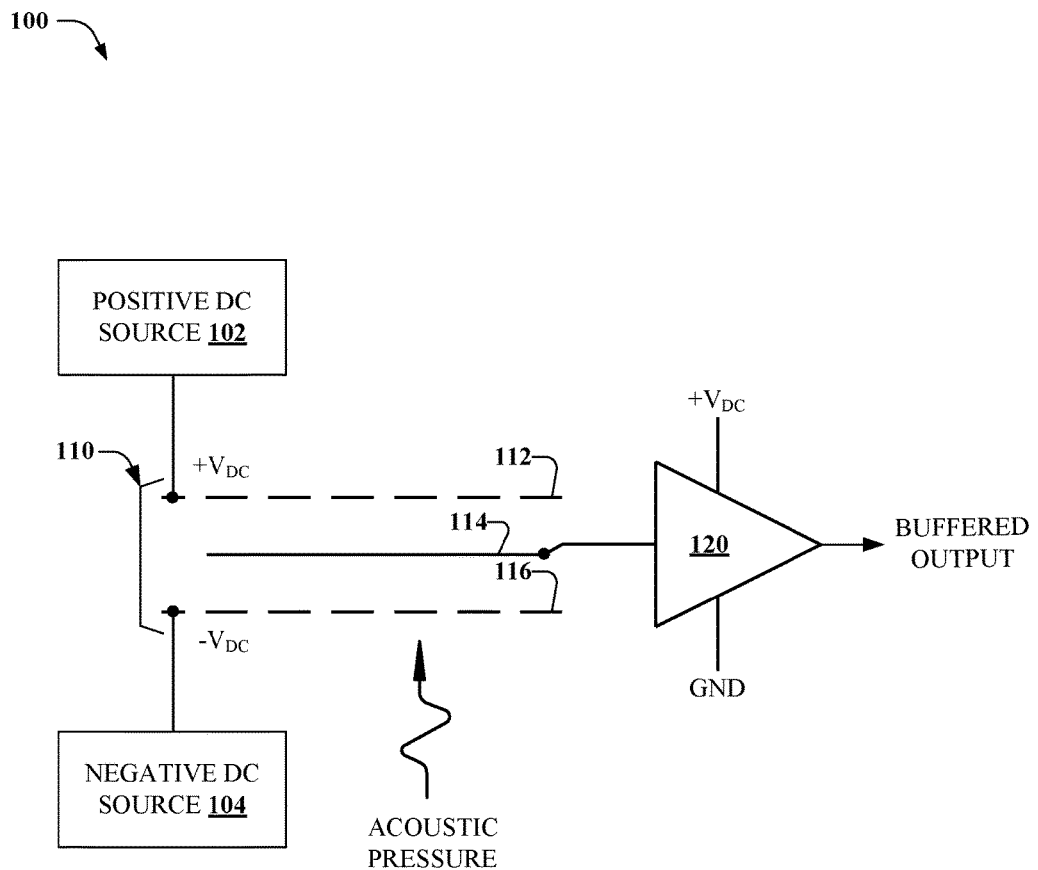
FIG. 1 illustrates a block diagram of a MEMS microphone with dual backplates, in accordance with various embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventional microphone technologies have had some drawbacks with respect to susceptibility to EMI. Various embodiments disclosed herein can improve noise rejection of a MEMS microphone by utilizing a membrane sandwiched between oppositely biased backplates.

For example, a MEMS microphone can comprise a flexible diaphragm, e.g., comprising a semiconductor material, conductor, etc. that converts an acoustic pressure, e.g., sound pressure, sound waves, etc. into an electrical signal. Further, the MEMS microphone can comprise a first, e.g., perforated, backplate and a second, e.g., perforated, backplate—the first backplate capacitively coupled to a first side of the flexible diaphragm and biased at a first, e.g., positive, direct current (DC) voltage, and the second backplate capacitively coupled to a second side of the flexible diaphragm and biased at a second, e.g., negative, opposite, etc. DC voltage. Furthermore, the MEMS microphone can comprise an electronic amplifier that buffers the electrical signal from the flexible diaphragm to generate a buffered output signal, e.g., voltage output, current output, etc. representing the acoustic pressure.

In this regard, the first DC voltage and/or the second DC voltage facilitate measuring sound pressure induced deflections of the flexible diaphragm as a time varying voltage and/or current—the sound pressure induced deflections generating a change in capacitance between the flexible diaphragm and the first/second backplate as the flexible diaphragm moves towards/away from the first/second backplate.

Further, in embodiment(s), the first/second backplate comprises a conductor/semiconductor that can at least partially shield, e.g., the flexible diaphragm, from unwanted noise, electromagnetic radiation, etc.—the first DC voltage and the second DC voltage effectively acting, e.g., via small signal analysis, as respective ground potentials shunting externally generated electromagnetic radiation, EMI, noise, etc. to an alternating current (AC) ground.

In an embodiment, the MEMS microphone can comprise a first DC voltage source, e.g., positive charge pump, which biases the first backplate at the first DC voltage, e.g., a positive DC voltage. Further, the MEMS microphone can comprise a second DC voltage source, e.g., negative charge pump, that biases the second backplate at the second DC voltage, e.g., a negative DC voltage, e.g., equal in magnitude, but opposite in polarity, to the positive DC voltage. In this regard, electric fields generated by the first DC voltage/positive DC voltage and the second DC voltage/negative DC voltage can center the flexible diaphragm between the first backplate and the second backplate, e.g., to prevent, limit, etc. the flexible diaphragm from generating an asymmetrical buffered output signal in response to not being centered between the first backplate and the second backplate.

In another embodiment, the first DC voltage and the second DC voltage can control a sensitivity of the MEMS microphone with respect to decibels (dBs) of sound pressure level (SPL) that have been applied to the flexible diaphragm. For example, the dynamic range of the MEMS microphone can be increased, e.g., to detect a large SPL, e.g., greater than 140 dB, by increasing respective gaps between the flexible diaphragm and the first and second backplates, e.g., to prevent the flexible diaphragm from impacting, contacting, etc. the first/second backplates during application of the large SPL. In this regard, the first DC voltage and the second DC voltage can be increased to maintain a constant sensitivity of the MEMS microphone in response to the respective gaps being increased.

In yet another embodiment, a MEMS microphone can comprise a pair of oppositely biased, e.g., perforated, backplates, e.g., comprising a conductor, a semiconductor, etc. Further, the MEMS microphone can comprise an acoustic membrane, e.g., comprising a conductor, a semiconductor, etc. that is sandwiched, via respective air gaps, between the pair of oppositely biased backplates. Furthermore, the MEMS microphone can comprise an electronic amplifier that buffers the electrical signal to generate an output signal representing the acoustic vibration.

In an embodiment, a first backplate of the pair of oppositely biased backplates is biased with a first DC voltage, and a second backplate of the pair of oppositely biased backplates is biased with a second DC voltage, e.g., the first DC voltage being equal in magnitude, but opposite in polarity, to the second DC voltage.

In one embodiment, the MEMS microphone further comprises a first DC voltage source that generates the first DC voltage, and a second DC voltage source that generates the second DC voltage. In another embodiment, the first DC voltage and/or the second DC voltage controls a sensitivity of the MEMS microphone with respect to dBs of SPL that have been applied to the acoustic membrane.

In yet another embodiment, a first backplate of the pair of oppositely biased backplates and/or a second backplate of the pair of oppositely biased backplates shields the acoustic membrane from at least a portion of electromagnetic radiation.

In an embodiment, a method can comprise enclosing a diaphragm between backplates—the diaphragm converting an acoustic pressure into an electrical signal. Further, the method can comprise electrically coupling the backplates to respective DC voltage sources that oppositely bias the backplates, and electrically coupling the diaphragm to an electronic amplifier that generates a buffered signal representing the acoustic pressure.

In another embodiment, the method can comprise modifying, via the respective DC voltage sources, a sensitivity of the MEMS microphone with respect to dBs of SPL that have been applied to the diaphragm.

In yet another embodiment, the method can comprise at least partially shielding, via the backplates, the diaphragm from electromagnetic radiation.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Aspects of MEMS microphones, apparatus, devices, processes, and process blocks explained herein can be embodied within hardware, such as an application specific integrated circuit (ASIC) or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

Conventional microphone technologies have had some drawbacks with respect to being susceptible to EMI. On the other hand, various embodiments disclosed herein can improve noise rejection of a MEMS microphone by sandwiching, via air gaps, an acoustic membrane between oppositely biased backplates. In this regard, and now referring to FIG. 1, MEMS microphone 100 can comprise MEMS acoustic sensor 110 and electronic amplifier 120. In this regard, MEMS acoustic sensor 110 comprises flexible diaphragm 114, e.g., comprising a semiconductor material, a conductor, etc. that converts an acoustic pressure, e.g., sound pressure, sound wave, etc. into an electrical signal, and perforated backplates (112, 116), e.g., comprising a conductor, semiconductor, etc. that are capacitively coupled to respective sides of flexible diaphragm 114. As illustrated by FIG. 1, perforated backplate 112 is biased by positive DC source 102, e.g., positive charge pump, switch capacitor voltage source, etc. at a positive DC voltage ($+V_{DC}$). Further, perforated backplate 116 is biased, oppositely biased, etc. by negative DC source 104, e.g., negative charge pump, switch capacitor voltage source, etc. at a negative DC voltage ($-V_{DC}$), e.g., which is equal, substantially equal, etc. in magnitude, but opposite in polarity, to the positive DC voltage source.

In this regard, the positive/negative DC voltage facilitates measuring acoustic pressure induced deflections of flexible diaphragm 114 as a time varying voltage and/or current—such deflections generating a change in capacitance between flexible diaphragm 114 and the perforated backplates. In turn, electronic amplifier 120 can buffer the time varying voltage and/or current as a buffered output representing the acoustic pressure.

For example, in the embodiment illustrated by FIG. 1, as a positive going acoustic pressure wave first meets, and passes through, perforated backplate 116, it can deflect flexible diaphragm 114 away from perforated backplate 116 and towards perforated backplate 112—causing a time varying voltage and/or current that can be detected via electronic amplifier 120. In this regard, the negative DC voltage on perforated backplate 116 enables electronic amplifier 120 to generate a non-inverted transfer function with respect to the positive input acoustic pressure wave first meeting perforated backplate 116, e.g., generating a positive going buffered output that is in phase with, or of the same polarity as, the positive going acoustic pressure wave.

In one embodiment, electronic amplifier 120 can generate the non-inverted transfer function in response to detecting an increase in capacitance between flexible diaphragm 114 and positively biased perforated backplate 112 as flexible diaphragm 114 moves towards positively biased perforated backplate 112. In another embodiment, electronic amplifier 120 can generate the non-inverted transfer function in response to detecting a decrease in capacitance between flexible diaphragm 114 and negatively biased perforated backplate 116 as flexible diaphragm 114 moves away from negatively biased perforated backplate 116.

In embodiment(s), positively biased perforated backplate 112 and negatively biased perforated backplate 116 can at least partially shield flexible diaphragm 114, e.g., comprising a high impedance node, from unwanted noise, electromagnetic radiation, etc. In this regard, the biased perforated backplates can effectively act, e.g., via small signal analysis, as respective ground potentials shunting externally generated electromagnetic radiation, EMI, noise, etc. to a small signal analysis alternating current (AC) ground.

In other embodiment(s), the oppositely biased perforated backplates 112 and 116 can generate opposing electric fields that can center flexible diaphragm 114 between perforated backplates 112 and 116, e.g., to prevent, limit, etc. flexible diaphragm 114 from generating an asymmetrical buffered output.

Figure 2:
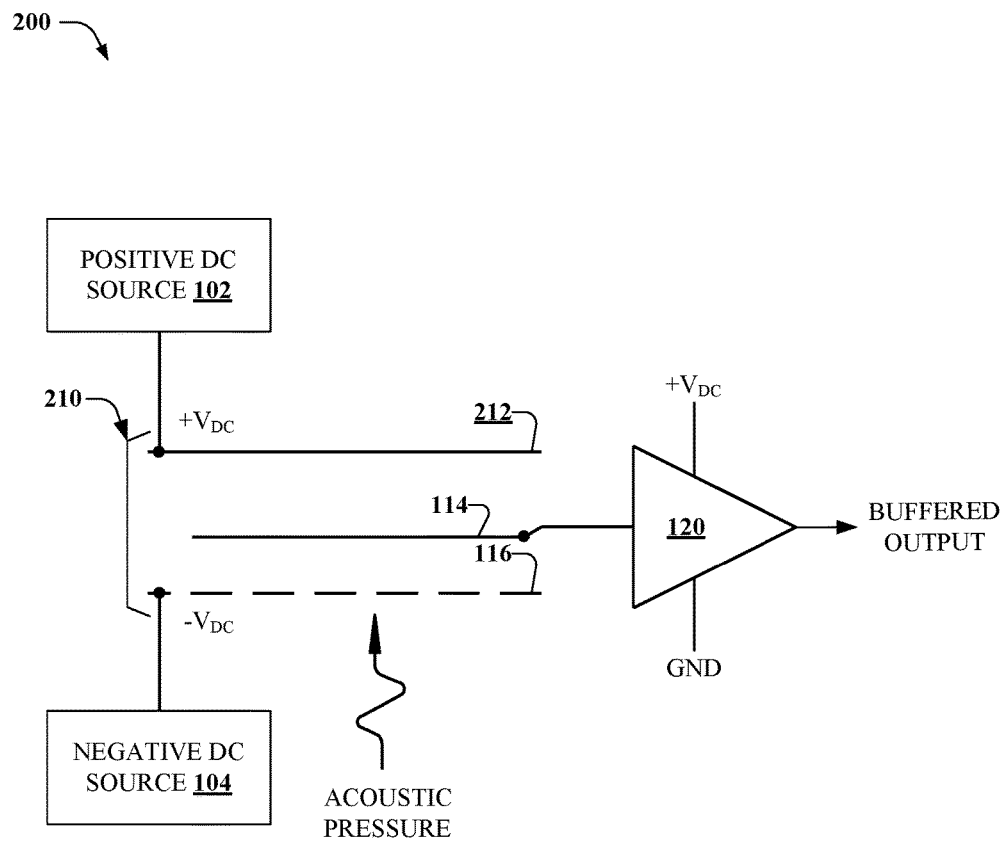
FIG. 2 illustrates a block diagram of another MEMS microphone with dual backplates, in accordance with various embodiments.

Referring now to an embodiment illustrated by FIG. 2, MEMS microphone 200 can comprise MEMS acoustic sensor 210 and electronic amplifier 120. In this regard, MEMS acoustic sensor 210 comprises flexible diaphragm 114, perforated backplate 116, and non-perforated backplate 212. As illustrated by FIG. 2, flexible diaphragm 114 can be positioned closer to negatively biased perforated backplate 116, and farther from positively biased non-perforated backplate 212—such backplates at least partially shielding flexible diaphragm 114 from unwanted noise, EMI, etc. Further, to account for the offset positioning of flexible diaphragm 114 with respect to the backplates, negative DC source 104 can bias perforated backplate 116 at a negative DC voltage that is greater in magnitude than a positive DC voltage biasing non-perforated backplate 212, e.g., such biases generating non-balanced and opposing electric fields that can prevent, limit, etc. flexible diaphragm 114 from generating an asymmetrical buffered output, a non-linear response, e.g., preventing, limiting, etc. flexible diaphragm 114 from impacting, contacting, etc. the perforated and/or non-perforated backplate, etc.

Figure 3:
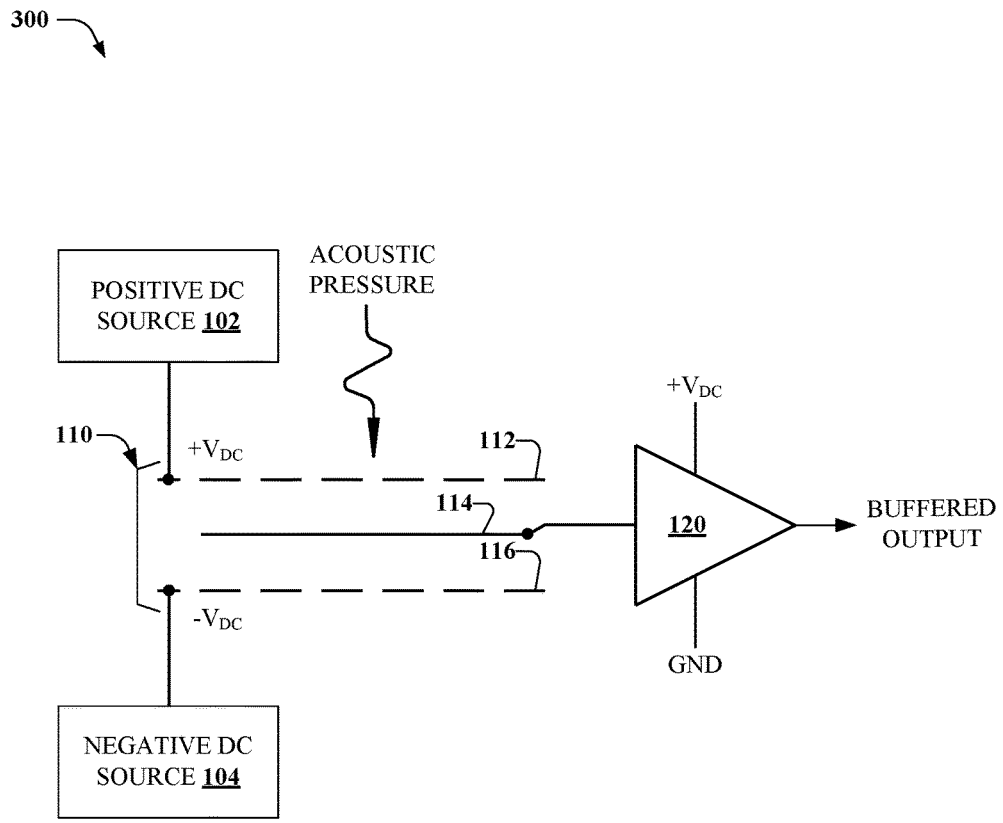
FIG. 3 illustrates a block diagram of a MEMS microphone with a non-perforated backplate, in accordance with various embodiments.

In an embodiment illustrated by FIG. 3, as a positive going acoustic pressure wave first meets, and passes through, perforated backplate 112, it can deflect flexible diaphragm 114 away from perforated backplate 112 and towards perforated backplate 114—causing a time varying voltage and/or current that can be detected via electronic amplifier 120. In this regard, the positive DC voltage on perforated backplate 112 can enable electronic amplifier 120 to generate an inverted transfer function with respect to the positive input acoustic pressure wave first meeting perforated backplate 112, e.g., generating a negative going buffered output that is 180 degrees out of phase with, or opposite in polarity to, the positive going acoustic pressure wave.

Figure 4:
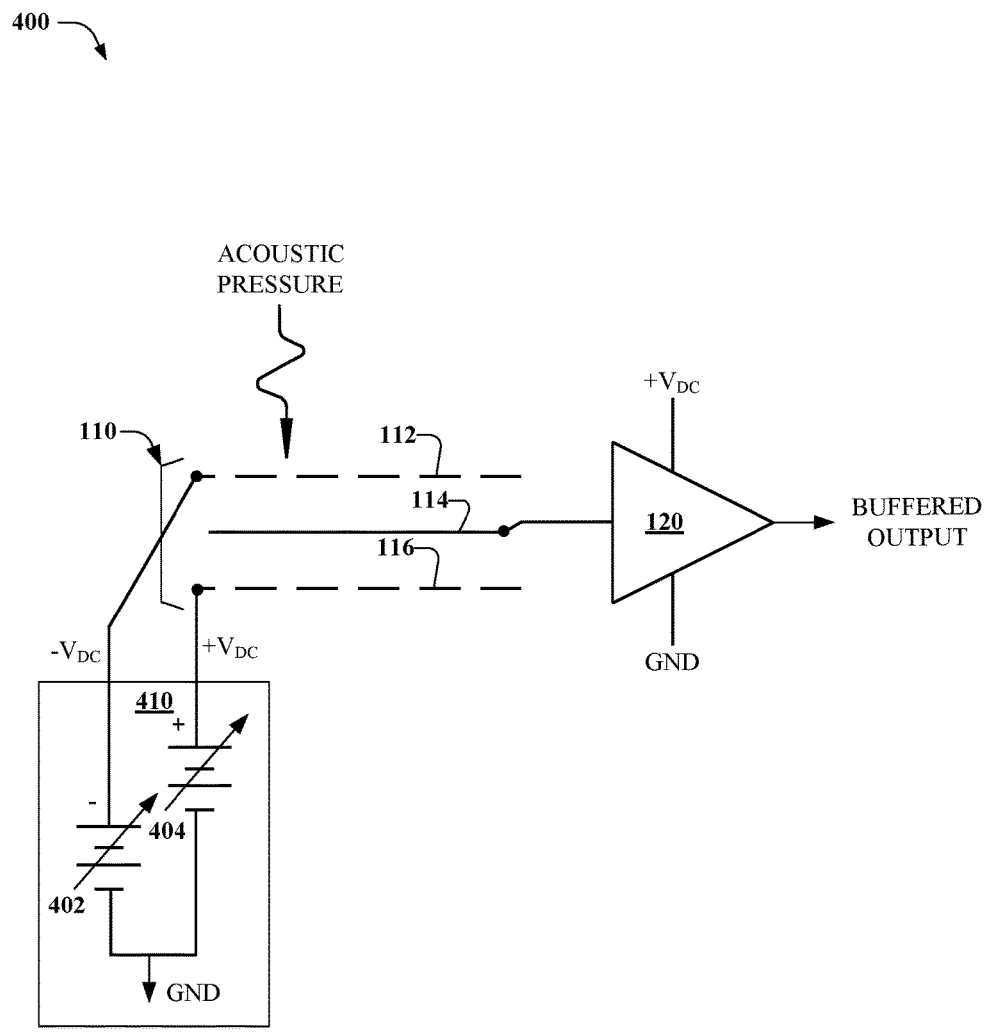
FIG. 4 illustrates a block diagram of a MEMS microphone biased with programmable voltage sources, in accordance with various embodiments.

Now referring to FIG. 4, a block diagram of a MEMS microphone (400) biased with programmable voltage sources is illustrated, in accordance with various embodiments. In this regard, programmable voltage sources 410, e.g., charge pumps, switched capacitor voltage sources, etc. can comprise programmable negative DC voltage source 402 that can bias perforated backplate 112 at a programmable negative DC voltage ($-V_{DC}$). Further, programmable voltage sources 410 can comprise programmable positive DC voltage source 404 that can bias perforated backplate 116 at a programmable positive DC voltage ($+V_{DC}$), e.g., equal, substantially equal (e.g., within a few µV), etc., and opposite in sign, to $-V_{DC}$.

In this regard, programmable voltage sources 410 can be configured to control a sensitivity of MEMS microphone 400 with respect to dBs of SPL that have been applied to flexible diaphragm 114. For example, the dynamic range of MEMS microphone 400 can be increased, e.g., to detect a large SPL, e.g., greater than 140 dB, by increasing respective gaps between flexible diaphragm 114 and perforated backplates 112 and 116, e.g., to prevent flexible diaphragm 114 from impacting, contacting, etc. perforated backplates 112 and 116 during application of the large SPL. In this regard, voltages generated by programmable voltage sources 410 can be increased to maintain a constant sensitivity of MEMS microphone 500 in response to the respective gaps being increased.

Figure 5:
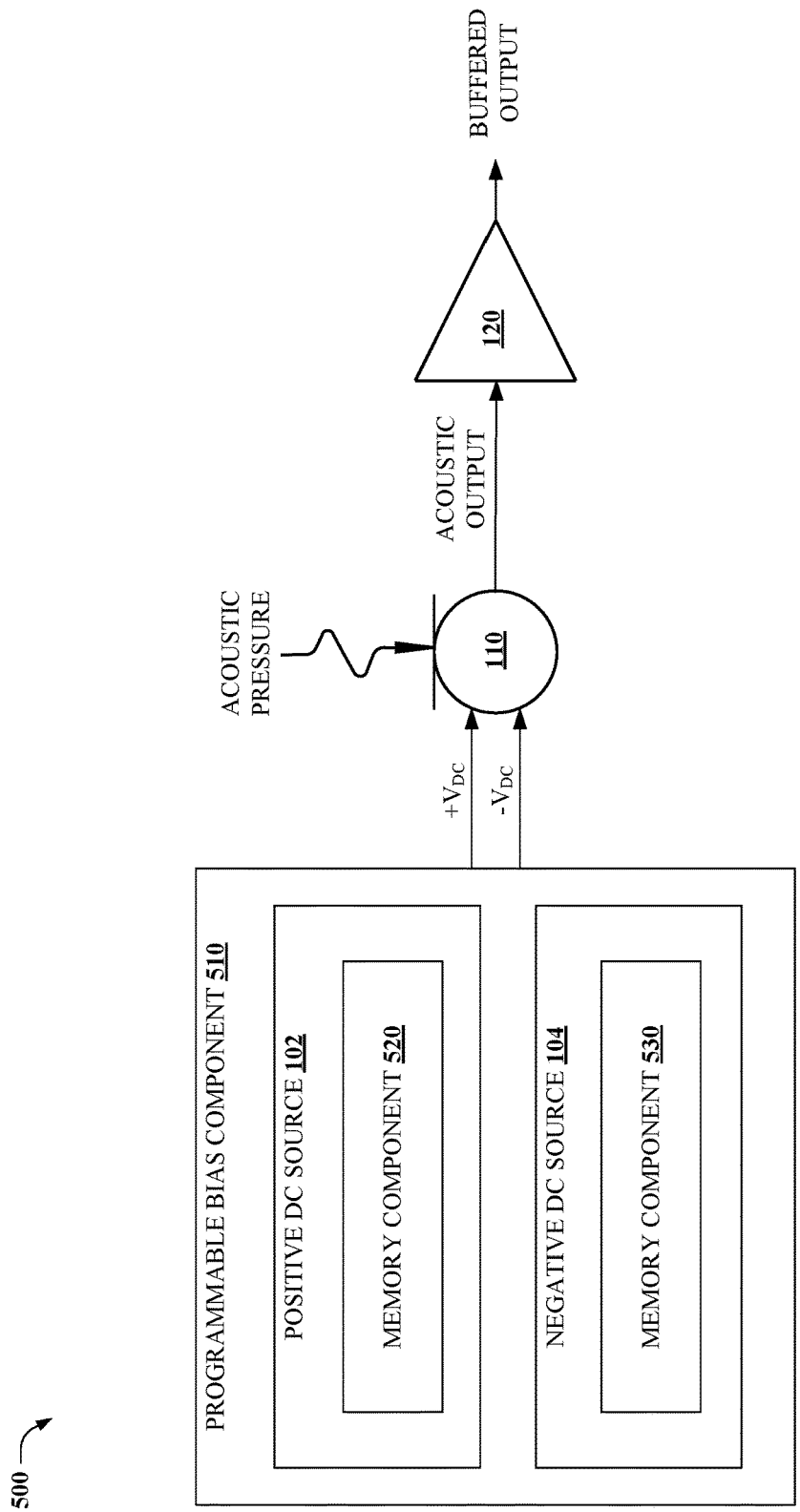
FIG. 5 illustrates a block diagram of a MEMS microphone comprising a programmable bias component, in accordance with various embodiments.
Figure 6:
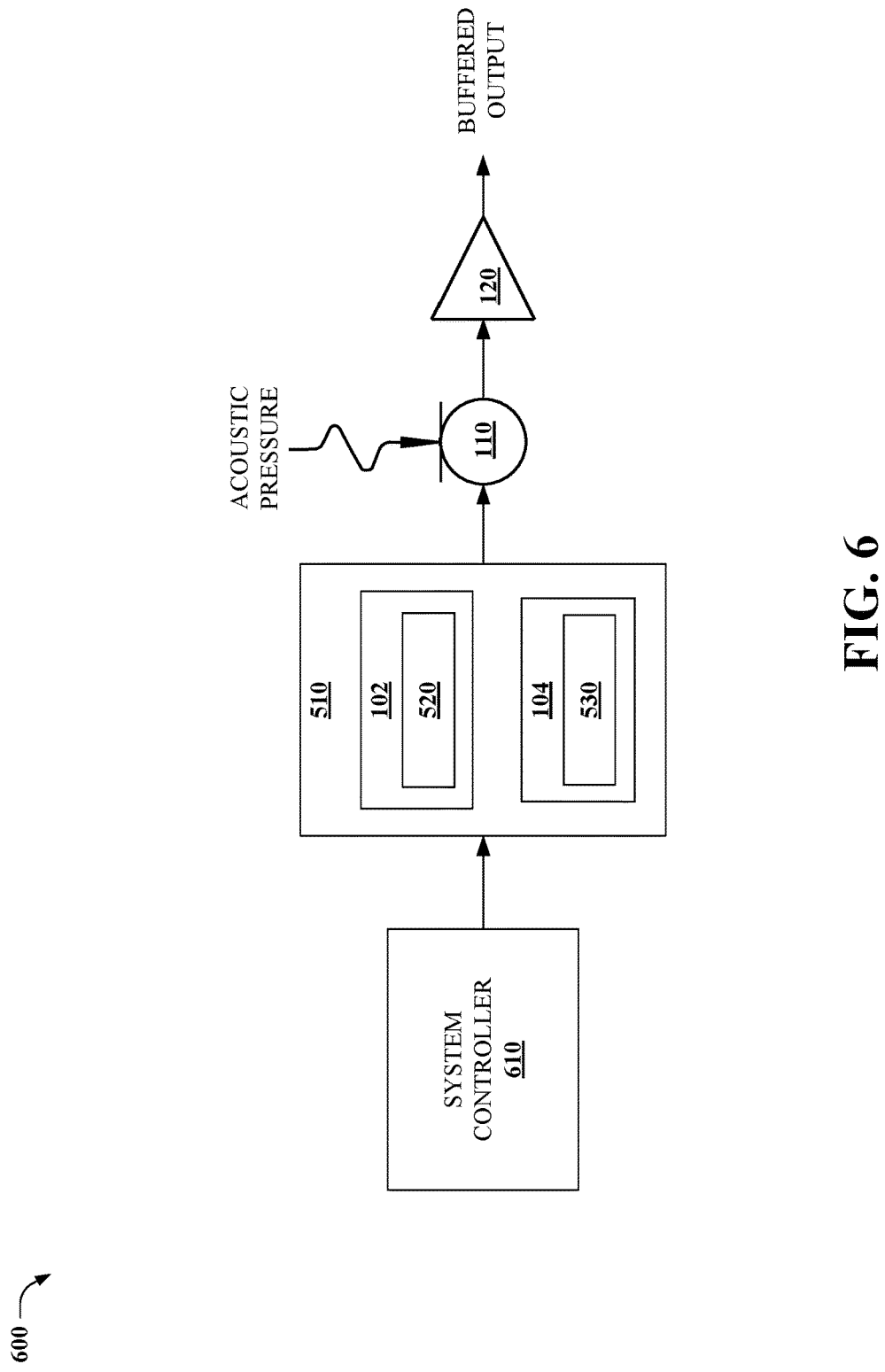
FIG. 6 illustrates a block diagram of a MEMS microphone system environment, in accordance with various embodiments.

Referring now to FIGS. 5 and 6, a block diagram of a MEMS microphone (500) comprising a programmable bias component (510), and a block diagram of a MEMS microphone system environment (600) are illustrated, respectively, in accordance with various embodiments. Programmable bias component 510 comprises positive DC source 102 and negative DC source 104, which comprise respective memory components (520, 530), e.g., a programmable fuse, a non-volatile memory, a volatile memory, etc. that can store data for trimming, controlling, etc. component(s) of positive DC source 102 and negative DC source 104, e.g., for setting, defining, etc. output bias voltages coupled to MEMS acoustic sensor 110, e.g., $+V_{DC}$, $-V_{DC}$. In an embodiment illustrated by FIG. 6, system controller 610, e.g., a processor, microcontroller, etc. can be communicatively coupled to MEMS microphone 500 to program, set, etc. the data stored in memory components 520 and 530.

Figure 7:
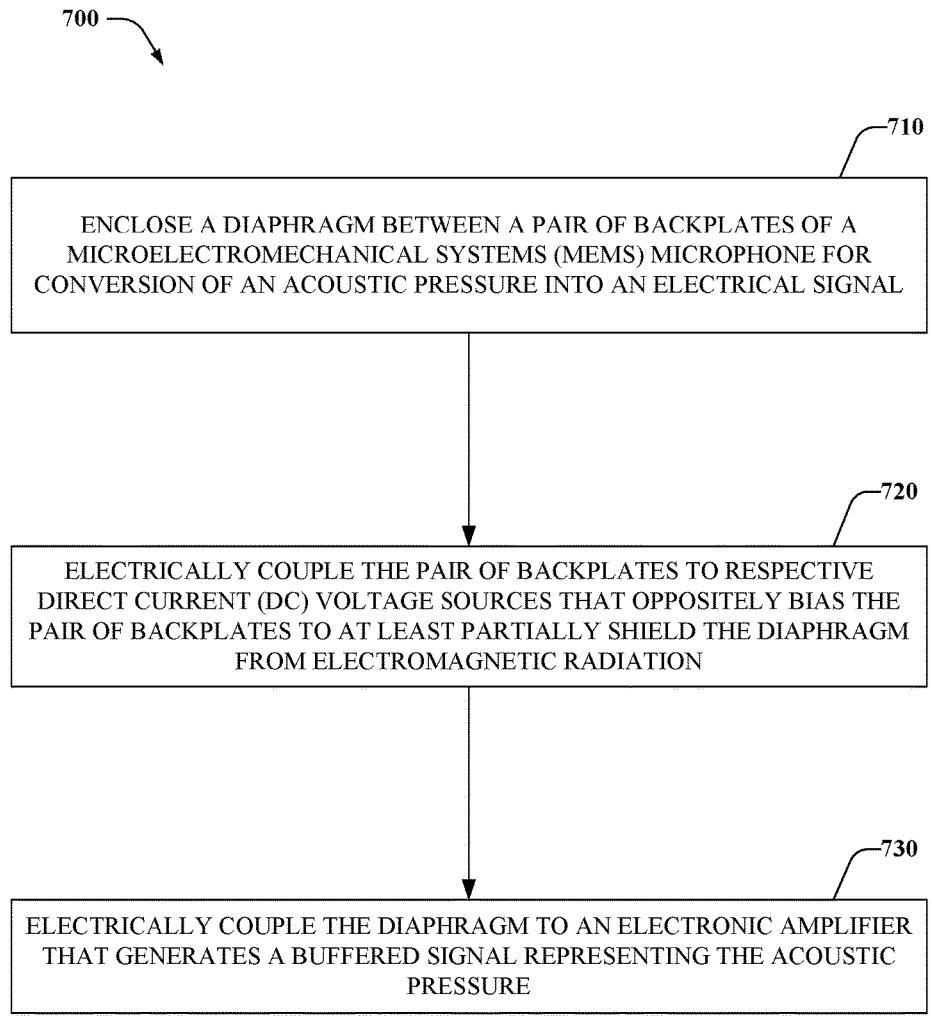
FIGS. 7-9 illustrate flowcharts of methods associated with a MEMS microphone, in accordance with various embodiments.

FIGS. 7-10 illustrate methodologies associated with a MEMS microphone, in accordance with various non-limiting aspects of the disclosed subject matter. In this regard, as illustrated by FIG. 7, a diaphragm, flexible acoustic membrane, etc. can be enclosed, sandwiched (e.g., via air), etc. between a pair of backplates of the MEMS microphone, at 710, for conversion of an acoustic pressure into an electrical signal.

At 720, the pair of backplates can be electrically coupled to respective DC voltage sources, e.g., a positive DC voltage source and a negative DC voltage, that oppositely bias the pair of backplates to at least partially shield the diaphragm, flexible acoustic membrane, etc. from electromagnetic radiation, EMI, etc.

At 730, the diaphragm, flexible acoustic membrane, etc. can be electrically coupled to an electronic amplifier that generates a buffered output signal representing the acoustic pressure.

Figure 8:
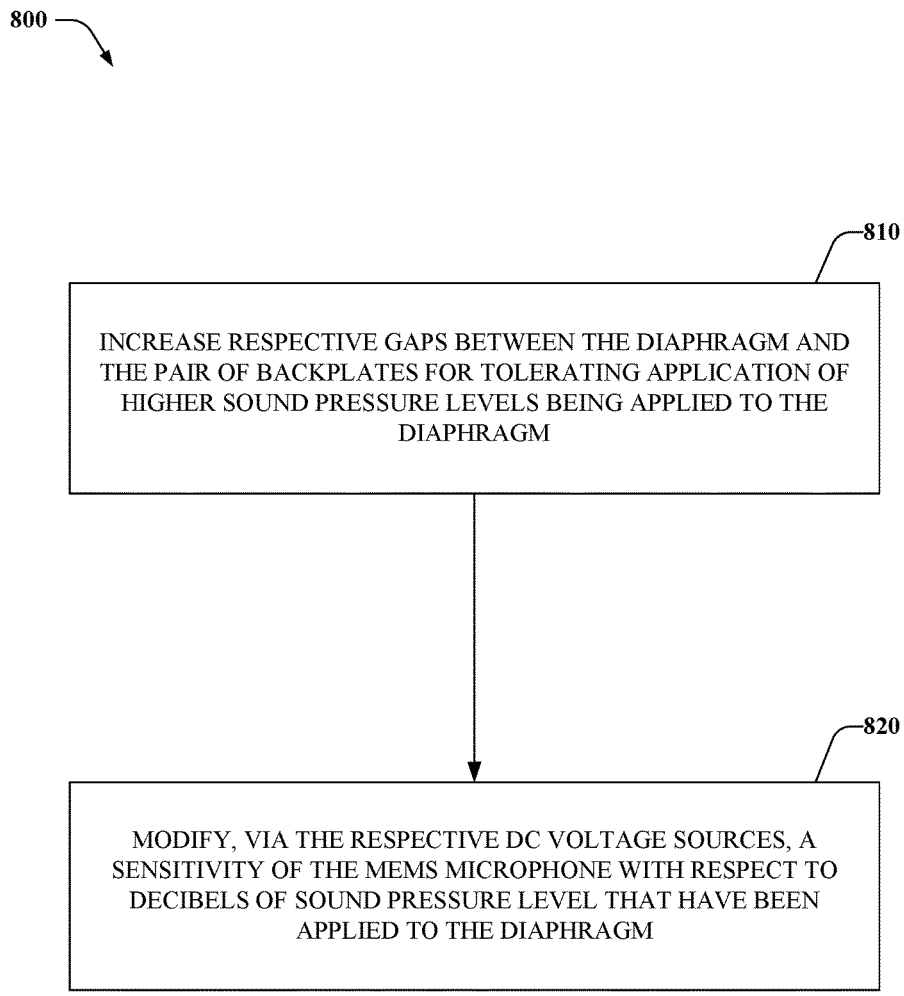

Referring now to FIG. 8, at 810, respective gaps between the diaphragm, flexible acoustic membrane, etc. and the pair of backplates can be increased for tolerating application of higher sound pressure levels being applied to the diaphragm, flexible acoustic membrane, etc.

At 820, a sensitivity of the MEMS microphone with respect to dBs of SPL that have been applied to the diaphragm, flexible acoustic membrane, etc. can be modified via the respective DC voltage sources.

Figure 9:
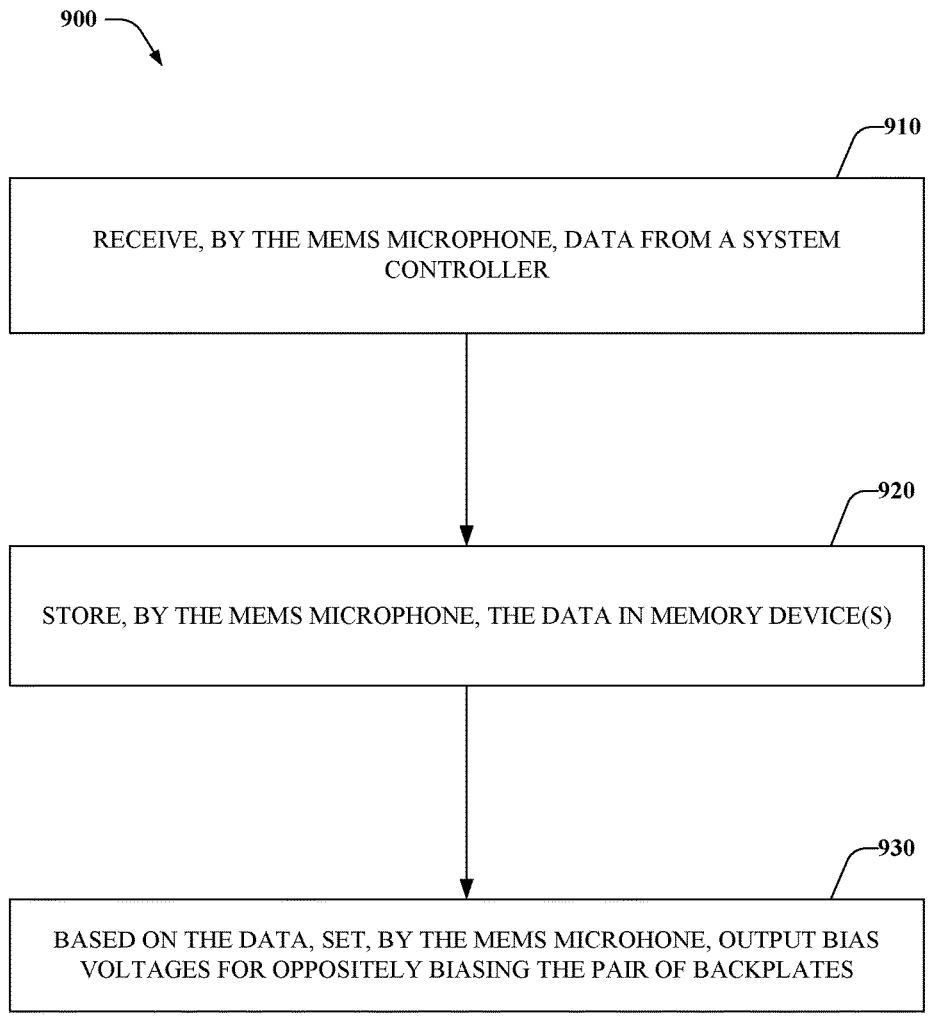

Now referring to FIG. 9, at 910, the MEMS microphone can receive data from a system controller. At 920, the MEMS microphone can store the data, e.g., in memory device(s). At 930, the MEMS microphone can set, based on the data, output bias voltages for oppositely biasing the pair of backplates.

As it employed in the subject specification, the terms "processor", "processing component", etc. can refer to substantially any computing processing unit or device, e.g., system controller 610, comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions and/or processes described herein. Further, a processor can exploit nano-scale architectures such as, but not limited to, molecular and quantum-dot based transistors, switches and gates, e.g., in order to optimize space usage or enhance performance of mobile devices. A processor can also be implemented as a combination of computing processing units, devices, etc.

In the subject specification, terms such as "memory" and substantially any other information storage component relevant to operation and functionality of MEMS microphones and/or devices disclosed herein, e.g., memory component 520, memory component 530, etc. refer to "memory components," or entities embodied in a "memory," or components comprising the memory. It will be appreciated that the memory can include volatile memory and/or nonvolatile memory. By way of illustration, and not limitation, volatile memory, can include random access memory (RAM), which can act as external cache memory. By way of illustration and not limitation, RAM can include synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and/or Rambus dynamic RAM (RDRAM). In other embodiment(s) nonvolatile memory can include read only memory (ROM), programmable ROM (PROM), electrically programmable ROM (EPROM), electrically erasable ROM (EEPROM), or flash memory. Additionally, the MEMS microphones and/or devices disclosed herein can comprise, without being limited to comprising, these and any other suitable types of memory.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A micro-electro-mechanical system (MEMS) microphone, comprising:
a first backplate that is biased at a first programable direct current (DC) voltage to facilitate modification of a sensitivity of the MEMS microphone with respect to a first air gap corresponding to a side of the first backplate;
a second backplate that is biased at a second programable DC voltage to facilitate the modification of the sensitivity of the microphone with respect to a second air gap corresponding to a side of the second backplate; and
a diaphragm that is enclosed between the first backplate and the second backplate and generates, based on the first programmable DC voltage and the second programmable DC voltage, an electrical signal representing an acoustic pressure, wherein the diaphragm comprises at least one of a semiconductor or a conductor, wherein the diaphragm is directly connected to an only non-power supply input of an electronic amplifier, and wherein the electronic amplifier buffers the electrical signal to generate a buffered output signal representing the acoustic pressure.

2. The MEMS microphone of claim 1, further comprising:
a first programmable DC voltage source that biases the first backplate at the first programmable DC voltage, wherein the first programmable DC voltage comprises a positive DC voltage; and
a second programmable DC voltage source that biases the second backplate at the second programmable DC voltage, wherein the second programmable DC voltage comprises a negative DC voltage.

3. The MEMS microphone of claim 1, wherein the sensitivity corresponds to decibels of sound pressure level that have been applied to the diaphragm.

4. The MEMS microphone of claim 1, wherein at least one of the first backplate or the second backplate acts as at least a partial shield of electromagnetic radiation.

5. The MEMS microphone of claim 1, wherein at least one of the first backplate or the second backplate is perforated.

6. The MEMS microphone of claim 1, wherein the first backplate and the second backplate comprise at least one of respective conductors or respective semiconductors.

7. A micro-electro-mechanical system (MEMS) microphone, comprising:
a pair of oppositely biased backplates, wherein a first backplate of the pair of oppositely biased backplates is biased with a first programmable direct current (DC) voltage to facilitate modification of a sensitivity of the MEMS microphone with respect to air gaps corresponding to respective sides of the pair of oppositely biased backplates, and wherein a second backplate of the pair of oppositely biased backplates is biased with a second programmable DC voltage to facilitate the modification of the sensitivity of the MEMS microphone with respect to the air gaps; and
an acoustic membrane sandwiched, via the air gaps, between the pair of oppositely biased backplates, wherein the acoustic membrane comprises at least one of a conductor or a semiconductor, wherein the diaphragm is directly connected to a sole non-power supply input of an electronic amplifier and converts, based on the first programmable DC voltage and the second programmable DC voltage, an acoustic vibration into an electrical signal, and wherein the electronic amplifier buffers the electrical signal to generate an output signal representing the acoustic vibration.

8. The MEMS microphone of claim 7, further comprising:
a first programmable DC voltage source that generates the first programmable DC voltage; and a second programmable DC voltage source that generates the second programmable DC voltage.

9. The MEMS microphone of claim 8, wherein the first programmable DC voltage source increases the first programmable DC voltage and the second programmable DC voltage source increases the second programmable DC voltage to maintain the sensitivity of the MEMS microphone.

10. The MEMS microphone of claim 8, wherein the first programmable DC voltage is positive, and wherein the second programmable DC voltage is negative.

11. The MEMS microphone of claim 8, wherein the sensitivity of the MEMS microphone corresponds to decibels of sound pressure level that have been applied to the acoustic membrane.

12. The MEMS microphone of claim 7, wherein at least one of the first backplate or the second backplate shields the acoustic membrane from at least a portion of electromagnetic radiation.

13. The MEMS microphone of claim 7, wherein at least one of the first backplate or the second backplate is perforated.

14. A method, comprising:
enclosing a diaphragm of a micro-electro-mechanical system (MEMS) microphone between a pair of backplates that have been oppositely biased with respective programmable direct current (DC) voltages to control a sensitivity of the MEMS microphone corresponding to air gaps that are adjacent to respective sides of the pair of backplates, wherein the diaphragm comprises a conductive material that converts, based on the respective programable DC voltages, an acoustic pressure into an electrical signal, wherein the diaphragm is directly connected to an only non-power supply input of an electronic amplifier, and wherein the electronic amplifier generates, based on the only non-power supply input, a buffered signal representing the acoustic pressure; and
electrically coupling the pair of backplates to respective programable DC voltage sources that generate the respective programmable DC voltages.

15. The method of claim 14, wherein the electrically coupling comprises:
electrically coupling a first backplate of the pair of backplates to a positive programmable DC voltage source of the respective programmable DC voltage sources; and
electrically coupling a second backplate of the pair of backplates to a negative programmable DC voltage source of the respective programmable DC voltage sources.

16. The method of claim 15, further comprising:
based on received data, modifying output voltages of the respective programmable DC voltage sources.

17. The method of claim 14, further comprising:
modifying, via the respective programmable DC voltage sources, the sensitivity of the MEMS microphone with respect to decibels of sound pressure level that have been applied to the diaphragm.

18. The method of claim 14, further comprising:
at least partially shielding, via the pair of backplates, the diaphragm from electromagnetic radiation.

* * * * *